United States Patent [19]
Ogawa et al.

[11] 3,978,514
[45] Aug. 31, 1976

[54] DIODE-INTEGRATED HIGH SPEED THYRISTOR

[75] Inventors: Takuzo Ogawa; Tsutomu Yatsuo; Keiichi Morita, all of Hitachi, Japan

[73] Assignee: Hitachi, Ltd., Japan

[22] Filed: Feb. 13, 1974

[21] Appl. No.: 442,242

Related U.S. Application Data

[63] Continuation-in-part of Ser. No. 55,313, July 16, 1970, abandoned.

[30] Foreign Application Priority Data

July 18, 1969 Japan................................ 44-56464
July 6, 1973 Japan................................ 48-56462

[52] U.S. Cl.................................... 357/39; 357/49; 357/64; 357/86
[51] Int. Cl.² ........................................ H01L 29/747
[58] Field of Search .................. 357/20, 38, 39, 49, 357/64, 86

[56] References Cited

UNITED STATES PATENTS

| | | | |
|---|---|---|---|
| 3,123,750 | 3/1964 | Hutson et al. | 357/86 |
| 3,280,386 | 10/1966 | Philips | 357/39 |
| 3,440,114 | 4/1969 | Harper | 357/64 |
| 3,443,171 | 5/1969 | Knott et al. | 356/39 |
| 3,727,116 | 4/1973 | Thomas et al. | 357/38 |

FOREIGN PATENTS OR APPLICATIONS

| | | | |
|---|---|---|---|
| 6,811,845 | 2/1969 | Netherlands | 357/39 |
| 1,943,537 | 3/1970 | Germany | 357/64 |

*Primary Examiner*—Michael J. Lynch
*Assistant Examiner*—Jospeh E. Clawson, Jr.
*Attorney, Agent, or Firm*—Craig & Antonelli

[57] ABSTRACT

A diode-integrated high speed thyristor formed into one body by using a separation region for preventing interference between a thyristor and a diode.

8 Claims, 9 Drawing Figures

DIODE-INTEGRATED HIGH SPEED THYRISTOR

CROSS-REFERENCE TO RELATED APPLICATION

This is a continuation-in-part of application Ser. No. 55,313, filed on July 16, 1970, now abandoned.

FIELD OF THE INVENTION

The present invention relates to a diode-integrated high speed thyristor. The term diode-integrated high speed thyristor used throughout the specification means a composite element comprising a thyristor region of four layers of alternative conductivity types and a diode region of two layers of different conductivity types integrated into a single semiconductor substrate so as to have a central P-N junction of each region in common. This composite element functions as a usual thyristor in one direction and functions as a diode in the opposite direction thereof which a current of the same amount flows.

DESCRIPTION OF THE PRIOR ART

With the extension of the field of technology using power thyristors, a high speed thyristor having an excellent switching characteristic has come to be strongly desired. Such a requirement is particularly urgently needed for a thyristor for use in a chopper or inverter circuit. This requirement comes from the fact that a circuit component such as a capacitor or an inductance can be reduced in size by enhancing the operating frequency of a chopper or inverter circuit, that the circuit can be made small by reducing the phase number necessary for suppressing the ripple percentage within a predetermined value, and that the control characteristic of the subsequent circuits can be enhanced by the reduction of the ripple percentage. In a high frequency circuit, however, the inductance of a lead wire interconnecting the circuit elements, which causes no trouble in a commercial frequency circuit, imposes an undesirable influence upon the operating characteristics of the circuits. In order to cancel out the influence of inductance in a chopper or inverter circuit operating at a high frequency, a capacitor is inserted or a lead wire is made as short as possible.

In a chopper or inverter circuit, however, drastic reduction of size and noticeable enhancement of characteristics are not possible at present due to the presence of diodes and thyristors. This is firstly because the size of a diode or a thyristor is determined by the operating voltage and current and is hardly dependent on the operating frequency so that the diode or thyristor cannot be reduced in size even if the operating frequency is higher. The second reason is that a diode and a thyristor are used in a reversely parallel connection in a chopper or inverter circuit so that the lead wire for the reversely parallel connection enhancs the inductance of a high frequency circuit. The third reason is that a capacitor must be inserted to cancel out the above-described inductance.

The foregoing will be explained in detail. A reverse blocking thyristor used widely at present comprises a semiconductor substrate consisting of PNPN four layers of alternate conductivity types, a pair of main electrodes disposed in low resistance contact with the opposite outermost layers, and a gate electrode disposed in ohmic contact with either one of the intermediate layers. This thyristor is always in a blocking state in a reverse direction. The thyristor in the blocking state in a forward direction is triggered to a conducting state by applying a gate signal between the gate electrode and one of the main electrodes adjacent thereto so that a relatively large load current flows between the pair of main electrodes. However, once the thyristor is conducting, the thyristor cannot return to the blocking state by itself. In a D.C. control circuit such as a chopper or an inverter, an auxiliary circuit for commutation is normally connected in parallel with a thyristor in order to restore the thyristor in an on-state to an off-state.

Figure 1:
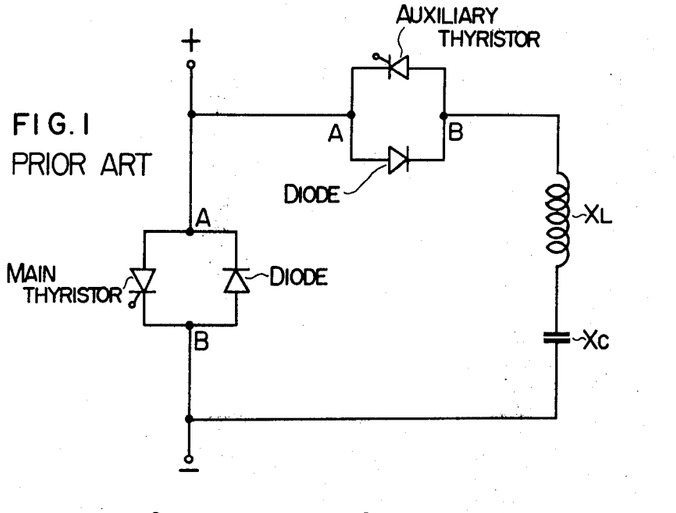
FIG. 1 is an electrical circuit diagram showing a conventionally known thyristor chopper circuit.

For example, a thyristor chopper circuit as shown in FIG. 1 is known. In this chopper circuit, a commutating circuit comprising an auxiliary thyristor, a reactor $X_L$ and a capacitor $X_C$ is connected in parallel with a main thyristor through which a load current flows. In order to turn off the main thyristor in the on-state through which the load current is flowing, the auxiliary thyristor is turned on to discharge the capacitor $X_C$ to superimpose an oscillating current on the load current flowing through the main thyristor. Consequently, the main thyristor is turned off during the period of the reverse current flow. In this chopper circuit, diodes connected reversely in parallel with the main and auxiliary thyristors function as a well known current bypath and a charging path for the commutating capacitor $X_C$, respectively.

In a chopper circuit, a high speed intermittence of a load current is generally required in order to achieve an excellent circuit control. So, the circuit is designed in such a manner that an oscillating circuit of high frequency flows in a commutating circuit. However, in the circuit operating at a high frequency, the inductance of a lead wire interconnecting the circuit components, which causes no trouble in the circuit operating at a commercial frequency, imposes an undesirable influence on the operating characteristics of the circuit.

For the chopper circuit shown in FIG. 1 there will now be considered the case where the main and auxiliary thyristors are of usual reverse blocking types and reversely parallel diode elements are discretely connected with the main and auxiliary thyristors respectively by means of external lead wires. When an oscillating current having a rapid raising characteristic flows through the commutating circuit and during the period of current flow into the diode elements the current variation ratio di/dt turns from positive to negative due to an electromotive force induced by an inductance of a lead wire between the points A and B, a forward voltage is applied between a pair of main electrodes of the thyristor element connected in parallel with the diode element in such a manner that the anode electrode becomes positive with respect to the cathode electrode. Therefore, the period during which a reverse voltage is applied to the thyristor element becomes shorter than a half of the reverse current flow period determined by the reactance of the reactor $X_L$ and capacitance of the capacitor $X_C$ of the commutating circuit. When the high speed switching characteristic of the thyristor element cannot be improved or the turn-off time of the thyristor element cannot be reduced to a value smaller than a predetermined value, the reactor $X_L$ and capacitor $X_C$ must be increased in size to extend the oscillating period of the commutating circuit. This leads to an increased size and weight of the entire circuit as well as the difficulty of a high speed intermittence operation of the chopper.

In order to reduce the size of a chopper or inverter circuit and to enhance the characteristics thereof, a semiconductor element wherein a diode and a thyristor are integrated adjacently in the same semiconductor substrate in a reversely parallel connection.

To integrate a thyristor and a diode adjacently in the same semiconductor substrate in such a manner that their rectifying directions are opposite to each other is known, for example, by the U.S. Pat. No. 3,476,993 or U.S. Pat. No. 3,437,889. If such a structure is used in a chopper or inverter circuit, the above-described undesirable influence due to the inductance of a lead wire will be eliminated.

Further, an element having such a structure has an excellent blocking function and a high speed switching characteristic as a thyristor element itself. In other words, when the opposite outermost layers of a thyristor region consisting of PNPN four layers are made with a shorted emitter structure (see R. W. Aldrich et al: J. Appl. Phys. 30, 1819 (1959)), it is possible to make the effective emitter efficiency zero with the result that there is no fear that a leakage current of the junction is amplified by a transistor action. Accordingly, it is possible to obtain the element having a small leakage current, an excellent voltage blocking function and an increased operating temperature in the junction. Also, the base layer (high resistivity layer) can be made thinner in comparison with a reverse blocking thyristor which can block the same forward voltage. Therefore, since a large number of life time killers can be doped into a semiconductor substrate, the turn-off time can be remarkably reduced.

As described above, a composite thyristor has several advantages in the application thereof to a D.C. control circuit such as a chopper or an inverter, as well as a possibility of enhancing a blocking function or a high speed switching characteristic as a thyristor element itself.

Though a composite thyristor has the above-mentioned advantages, there is a problem in the case where the composite thyristor is used in a chopper or inverter circuit. This is due to the interference action occurring between the integrated thyristor region and diode region. The composite thyristor as used in the chopper circuit shown in FIG. 1 bears the following condition. That is, when a forward voltage is again applied to the thyristor region after a current has flowed through the integrated diode region, the thyristor region has to be restored to a state in which the forward voltage is blocked. However, it has been found in the hitherto known composite thyristor that just after a current having a high peak value and a high current decrease ratio di/dt has flown through the diode region, the thyristor region cannot restored to its offstate at a low voltage increase ratio dv/dt on the application of the forward voltage and thereby fails to achieve a chopper or inverter operation, even if the period of the current flow through the diode region which period corresponds to the reverse voltage period of the thyristor is sufficiently longer than the turnoff time of the thyristor region. It may be estimated that such a phenomenum takes place due to the following interference. That is, during the reverse voltage period of the thyristor region, a large number of minority carriers injected through the central junction into the base layer (high resistivity layer) of the diode region by the current flowing to the diode region move transversely toward the thyristor region to become the stored majority carriers therein, with the result that these stored carriers behave with just the same action as gate-triggering to readily turn on the thyristor region.

Thus, a composite thyristor in which a diode region and a thyristor region are integrated adjacently in the same semiconductor substrate in a reversely parallel connection cannot be implemented in a chopper or inverter circuit. The implementation requires the prevention of the interference between the integrated thyristor region and diode region. A composite element in which a thyristor region encounters a malfunction due to such an interference is known, for example, by the U.S. Pat. No. 3,443,171 which discloses the so-called bidirectional thyristor consisting of two thyristor regions integrated adjacently in the same semiconductor substrate in reversely parallel connection. When a current is commutated from one direction to the opposite direction, this bidirectional thyristor may readily turn on with the result of the commutation failure by the influence of majority carriers stored in the intermediate layers of one thyristor region having been conducted in the one direction even if a control signal is applied to the other thyristor region.

However, it will be understood from the hereunder explanation that the significance of necessity and difficulty of the interference prevention is much greater in a composite thyristor consisting of an integrated thyristor region and a diode region rather than a bidirectional thyristor consisting two integrated thyristor regions.

It is well known by those skilled in the art relating to the design and manufacture of thyristors that in a thyristor consisting of the usual PNPN four layer arrangement, the initial conductive region, when the thyristor region becomes conductive by a control signal from the gate electrode, is formed in a very small area near the gate electrode, and the conductive region expands thereafter into the whole thyristor region in proportionality with time as the majority carriers stored into the intermediate layers diffuse transversely. The spreading speed of the conductive region is at most 0.1 mm/µs. In a bidirectional thyristor consisting of two integrated thyristor regions, on the other hand, even if the interfaces of the two thyristor regions are disposed adjacent to or in superimposed relation with each other, the problem of the interference at a high frequency operation will be readily eliminated by separating the initial conductive regions of the two thyristor regions. The separation is effected in such a manner that the width of the four layers of each of the two thyristor regions is selected sufficiently large to dispose the respective gate electrodes in the positions sufficiently spaced from an area where the two thyristor regions are arranged adjacent to each other. In a high frequency operation in which the width of the current flow through the respective thyristor regions is in order of several microseconds to several tens of microseconds, the conductive regions of the thyristor regions are formed in areas spaced from the control electrodes by at most 0.1 millimeters to several millimeters as described above and do not expand to the remaining four-layer area. This remaining area will serve to prevent the interference between the two thyristor regions. The stored minority carriers do not exist in the intermediate layers of such a remaining area and the stored carriers of the conductive region recombine and disappear in this area. Further, as a method of preventing the interference in the bidirectional thyristor, there is known a method in which one end of one outer layer (N emitter layer) belonging to one thyristor region is spaced in a projection direction from one end of one outer layer (N emitter) belonging to the other thyristor region. As understood readily by the skilled in the art, in a thyristor consisting of a PNPN four layer arrangement, the area through which current can flow is limited to the superimposing portion of the opposite outer layers in the projection direction and the portion extending from the end of the superimposing portion by the diffusion length of carriers. This is because electrons (or holes) injected from one emitter junction (a junction between one outer layer and intermediate layer adjacent thereto) enhances the injection of holes (or electrons) from the other emitter region so that the thyristor is turned on from its blocking state to conductive state and an inherent thyristor action of self-spreading of the conductive region is performed. Accordingly, the spacing of one outer layer in the projection direction as disclosed in the U.S. Pat. No. 3,443,171 enables the separation of the conductive region of one thyristor region from the other thyristor region so that the intermediate portion where no outer layers are superimposed will function as a separation region of two thyristor regions.

However, such a separation of conductive regions is difficult in a composite thyristor in which an element to be integrated with a thyristor is a diode having a central junction common therewith. The conductive region as explained above in conjunction with thyristor does not exist partially in a P-N junction diode. When a forward bias is applied, the injection of holes (or electrons) from a low resistivity layer to a high resistivity layer takes place immediately in the entire region of the diode junction so that current flows simultaneously in the entire junction region. Further, since the diode includes only one junction, it is impossible to provide another emitter junction in the diode region as in a thyristor consisting of four PNPN layers in which the current flow path can be limited by means of the superimposing portion of two emitter layers.

Therefore, the prevention of the interference in a diode-integrated thyristor requires a method different from the well known isolation method in the bidirectional thyristor.

SUMMARY OF THE INVENTION

A primary object of the present invention is to provide a small-sized semiconductor device wherein a thyristor and a diode are formed into one body.

A second object of the present invention is to provide a semiconductor device usable in a high frequency circuit, wherein a thyristor and a diode are formed into one body and the length of a connecting lead is reduced.

A third object of the present invention is to provide a semiconductor device, wherein a separation region is intergrated between a thyristor region and a diode region to eliminate a bad influence which the stored minority carriers in the diode region impose on the thyristor.

A fourth object of the present invention is to provide a separation means applicable to a diode-integrated thyristor.

A fifth object of the present invention is to provide a high voltage and large current diode-integrated high speed thyristor.

DESCRIPTION OF PREFERRED EMBODIMENTS

Now, the present invention will be described in detail with reference to the accompanying drawings.

Figure 2:
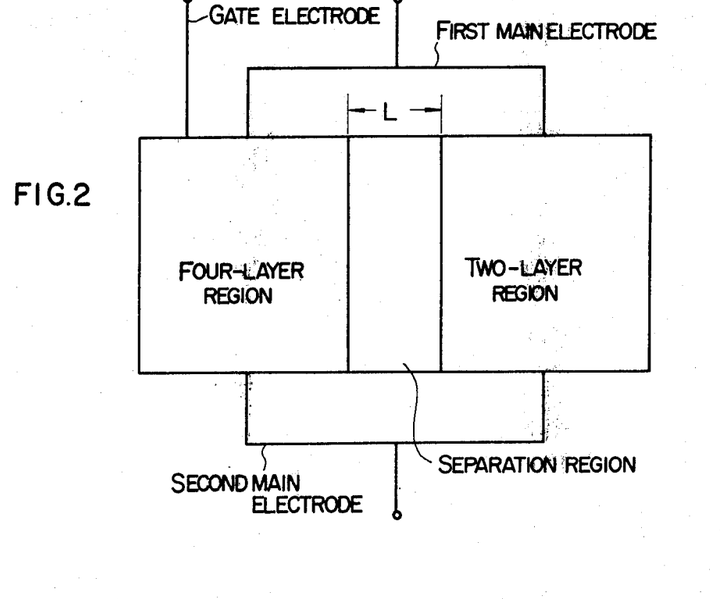
FIG. 2 is a block diagram for explaining a principle of a diode-integrated high speed thyristor of the present invention.

As shown in FIG. 2, a diode-integrated high speed thyristor of the present invention comprises a four-layer region and a two-layer region which are integrated through a separation therebetween in the same semiconductor substrate and in which their rectifying directions are opposite to each other. The four-layer region comprises four continuous layers, the conduction types thereof being changed alternatively with P type and N type and three P-N junctions being formed between the adjacent layers. This four-layer region functions as a thyristor by connecting a gate electrode to any one layer. The two-layer region comprises two adjacent layers of P conductivity type and N conductivity type, one P-N junction being formed between the two layers. This two-layer region functions as a diode through which a load current flows in one direction but does not flow in the other direction. The separation region comprises at least two adjacent layers of P conductivity type and N conductivity type, one P-N junction being formed between the two layers. This separation region does not cause substantially the flow of the load current therein and serves to cancel a bad influence of residual carriers of the two-layer region on the four-layer region. The separation region has a width L corresponding to at least the diffusion length of minority carriers to separate the four-layer region and the two-layer region by that width.

The operation of the thus constructed diode-integrated high speed thyristor will be now explained with respect to the case where the polarity of a voltage applied between the first main electrode and second main electrode is inverted from one state in which the P-N junction of the two-layer region is forwardly biased to the other state in which it is reversely biased. When a voltage biasing forwardly the P-N junction of the two-layer region is being applied between both main electrodes, substantially all of the load current flows in the two-layer region. When the polarity of a voltage being applied between both main electrodes is inverted, no load current flows in the two-layer region and just after the polarity inversion the minority carriers having been injected at the forward bias remain as residual carriers.

The number of the residual carriers is proportional to the value of the load current flowing at the forward bias and the load current decrease ratio at the time of the polarity inversion. The residual carriers diffuse in the main electrode direction with the result that some carriers recombine during the diffusion thereof or the carriers not recombined are drawn out from the main electrode and disappear. The other carries try to diffuse through the separation region into the four-layer region. However, since the width of the separation region is equal to or larger than the diffusion length of the minority carriers, most of the residual carriers trying to diffuse from the two-layer region to the four-layer region recombine and disappear in the separation region. Even if the residual carriers reach the four-layer region, the number of such carriers is small enough to turn on the four-layer region, so that there is no fear that any erroneous turn-on takes place. Thus, the undesirable influence of the residual carriers of the two-layer region on the four-layer region, i.e. the turn-on of the four-layer region before the application of a gate signal can be completely eliminated by providing, between the four-layer region functioning as a thyristor and the two-layer region functioning as a diode, the separation region whose width is equal to or larger than the diffusion length of the residual carriers and which does not function as a thyristor or diode.

One feature of the diode-integrated high speed thyristor according to the present invention is that, as described above, the four-layer region and the two-layer region are integrated, so as to have their rectifying directions opposite each other, in the same semiconductor substrate through the separation region therebetween those width is sufficiently large to prevent the diffusion of the minority carriers from the two-layer region to the four-layer region. The first feature implements a practical diode-integrated high speed thyristor in which the four-layer region functioning as a thyristor and the two-layer region functioning as a diode are integrated. The implementation of the diode-integrated high speed thyristor enables the reduction in size and weight of, the high frequency operation of and the improvement in reliability of a circuit such as chopper or inverter.

A further feature of the diode-integrated high speed thyristor according to the present invention is that the central P-N junction of three P-N junctions of the four-layer region is common with the P-N junction of the separation region and the P-N junction of the two-layer region. This second feature gives the following effect. That is, the central P-N junction determines a blocking voltage of the diode-integrated high speed thyristor. If this central P-N junction is formed individually from the P-N junction of the two-layer region, the P-N junctions of the four-layer region and two-layer region must have planar structures at the sides adjacent to these regions, thus making it difficult to provide a high blocking voltage. This disadvantage can be eliminated by the above-described second feature of the present invention.

The basic conception of means for limiting the current flow path of the two-layer region of the diode-integrated high speed thyristor according to the present invention is that in the state in which the load current flows in the integrated two-layer region the current flow path of the above-described separation region is substantially so long that the forward impedance of the current flow path of a portion which is to become the separation region is much larger than the impedance of the current flow path of a portion which is to become the two-layer region.

The concrete embodiments of the present invention will be now described in detail using the drawings.

Figure 3A:
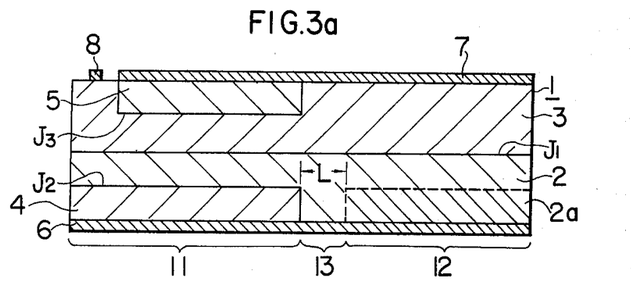
FIGS. 3a, 3b and 3c are schematic sectional diagrams of a diode-integrated high speed thyristor for illustrating a method of making a separation region which is the main part of the present invention.

FIG. 3a shows a first embodiment of the present invention. In FIG. 3a, reference numeral 1 designates a silicon or germanium semiconductor substrate, which consists of a first layer 2 having one conductivity type and a second layer 3 having the other conductivity type which form a central P-N junction $J_1$, a third layer 4 buried in the first layer 2 in a way that one surface thereof is exposed and a P-N junction $J_2$ is formed with the first layer 2, and a fourth layer 5 buried in the second layer 3 in a way that one surface thereof is exposed and a P-N junction $J_3$ is formed with the second layer 3. The third layer 4 and the fourth layer 5 are provided face to face through the first and second layers 2 and 3, and these layers constitute in the semiconductor substrate 1 a four-layer region (referred to as a thyristor region hereafter) 11. Numeral 2a designates a high impurity concentration layer having the same conductivity type as the first layer 2 and formed near the surface of the first layer 2 separated from the third layer 4 by a distance L, which forms a two-layer region (referred to as a diode region hereafter) 12. Numerals 6 and 7 designate ohmic contacts formed on the opposing principal surfaces of the semiconductor substrate 1, and 8 designates a gate electrode formed on the surface of the second layer 3. The thyristor region 11 and the diode region 12 function respectively as a controlled rectifier such as a usual thyristor element and a rectifier such as a usual P-N junction diode element. Also, the separation region 13 which is positioned between the thyristor region 11 and the diode region 13 and does not belong to those regions functions as a region for preventing the interference between the four-layer region 11 and the diode region 13, as described later.

When a voltage is applied to such a semiconductor element so that the diode region may be forwardly biased, for example, when the first layer 2 has an N conductivity type and the second layer 3 has a P conductivity type and a smaller resistivity than the first layer 2 and a voltage is applied between the ohmic contacts 6 and 7, so that the ohmic contact 7 becomes positive with respect to the ohmic contact 6, holes are injected into the first layer 2 through the whole region of the P-N junction $J_1$ of the diode region 12 and separation region 13. In this case, the numerical distribution of the injected holes at the P-N junction $J_1$ is determined by the current density at the respective locations of the P-N junction $J_1$. It will be readily understood that the voltage drop within the first layer 2 of the diode region 12 is smaller than that of the separation region 13, since, in the diode region 12, the high impurity concentration layer 2a is formed near the P-N junction $J_1$, whereas in the separation region 13, no high impurity concentration layer is formed. Due to this difference between the voltage drops, a load current concentrates in the diode region 12 and the number of the carriers flowing through the P-N junction $J_1$ in the vicinity of the separation region 13 becomes quite small. Accordingly, most of the load current flows through the diode region 12. When the forward bias voltage to the diode region 12 descreases and the reverse bias is applied, the holes injected at the time of forward bias remain in the diode region 12 as stored minority carriers. Since the number of stored minority carriers is determined by the amount of the load current, the number of carriers is large in the diode region 12 and very small in the separation region 13. Some of the stored minority carriers in the diode region 12 diffuse into the direction of the ohmic contacts 6 and 7. Among them, some carriers recombine during diffusion and the others move through the ohmic contact and disappear into the external circuit. The other stored minority carriers try to diffuse through the separation region 13 into the thyristor region 11, but most of them recombine and disappear while moving through the separation region 13 and only few carriers reach the thyristor region. Thus, there is no fear that the thyristor region 11 is turned on. In order that the separation region 13 makes most of the stored minority carriers diffusing from the diode region 12 to the thyristor region 11 recombine and disappear, the width of the separation region must be made at least equal to the diffusion length of the stored minority carriers. In this way, the bad influence of the stored minority carriers in the diode region imposing on the thyristor region that the thyristor may be turned on before the application of a gate signal can completely be eliminated by forming a separation region between the thyristor region and the diode region, whose width is equal to or larger than the diffusion length of stored minority carriers and which does not function as a thyristor nor a diode.

Figure 3B:
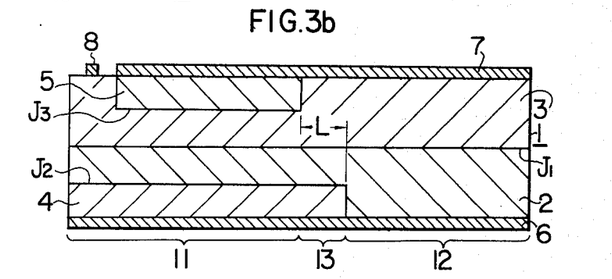

FIG. 3b shows a second embodiment of the present invention and the corresponding parts are shown by the same numerals as in FIG. 3a.

FIG. 3b, the third layer 4 is extended from the thyristor region 11 to the diode region 12 by a length L. In this way, a separation region 13 having two P-N junctions is formed between the thyristor region 11 and the diode region 12. The separation region 13 provides a PNP (or NPN) three-layer structure and has two P-N junctions. Wherein, the separation region 13 is a region which prevents the interference between the thyristor region and the diode region. The interference prevention effect of the separation region 13 in FIG. 3b will be now explained in the case where the first and second layers 2 and 3 are of N and P conductivity types respectively and the resistivity of the first layer 2 is higher than that of the second layer 3.

When a voltage is applied so that the ohmic contact 7 may become positive with respect to the ohmic contact 6 and a forward current flows in the diode region 12, a large number of minority carriers (holes) are injected from the low resistivity layer (second layer 3) into the high resistivity layer (first layer 2) across the central P-N junction $J_1$ of the diode region 12 and separation region 13. In this case, the number of holes injected into each portion will be proportional to the density of current flowing in that portion. In the separation region 13, the junction $J_2$ is being reversely biased by the external voltage and therefore provides an electrical barrier against the current component flowing in the straight direction from the ohmic contact 7 toward the ohmic contact 6. Thus, the current trying to flow into the separation region 13 is bent within the high resistivity layer (first layer 2) and then flows along the current flow path from the portion of the first layer 2 between the second layer 3 and the third layer 4 transversely toward the diode region, the forward voltage drop in the separation region 13 being higher than that in the diode region 12 where most of the current can go right on between the ohmic contacts 6 and 7. Therefore, the current density of the current component flowing across the central junction $J_1$ within the separation region 13 is extremely small so that the number of minority carriers (holes) injected into the high resistivity layer (first layer 2) of the separation region 13 will become negligibly small.

Also, the disappearance of the component of a large number of minority carriers (holes) stored in the high resistivity layer of the diode region 12 which component flows toward the thyristor region 11, to contribute to an erroneous operation of the thyristor region 11 or to cause the so-called interference, is possible through the recombination within the separation region 13 whose width is selected with a sufficient value L.

In the embodiment of FIG. 3b, the width L of the separation region 13 required for the prevention of the interference must firstly be equal to or larger than the diffusion length of minority carriers stored in the diode region 12 and must secondly be such that a transverse resistance of the first layer 2 made substantially thin by the third layer 4 is sufficiently high.

It is desirable to make the width L of the separation region 13 small as much as possible. This is based on the requirement of utilizing effectively the area of the semiconductor substrate by reducing the area which such a separation region providing no current path to both the forward and reverse currents occupies.

For this requirement, in FIG. 3b, it is preferable that the first layer 2 in which the third layer 4 extending toward the diode region 12 is buried is a high resistivity layer. This reason is that the forward drop of the current component flowing transversely in the first layer 2 within the separation region 13 can be made large with a relatively narrow width L. If the first layer 2 is a low resistivity layer, the width of the separation region 13 of a value unpractical to said requirement is needed. For example, in the case where a substrate of N conductivity type silicon of 50 Ω·cm is prepared and used as a mother material of the second layer 3, a P conductivity type impurity such as gallium and boron is diffused into the substrate to form the first layer 2 and an N conductivity type impurity such as phosphorous is diffused from a portion of the surface of the first layer 2 to form the third layer 4 extending toward the diode side, the transverse sheet resistance of the portion of the first layer 2 sandwiched between the second layer 3 and the third layer 4 is usually designed be 100 – 200Ω/□. In order that the transverse resistance of the sandwitched portion of the first layer 2 is about 100 times as high as the forward impedance at the forward current flow, the width L of 10 – 20 mm is needed. However, such a long width of the separation region 13 is not practical. On the other hand, in the case where silicon of the mother material is used for the first layer 2 and the second layer 3 is formed by diffusion, the width L of the separation region 13 required to obtain the same effect is 0.01 – 0.02 mm.

Also, in view of the above described requirement, the following more practical structure may be considered as a modification of the above second embodiment shown in FIG. 3b. That is, a high impurity concentration layer is buried in the portion of the second layer 3 exposed at one surface of the semiconductor substrate. The function of limiting the current flow path of the diode region 12 becomes more remarkable for the same reason as described with respect to the first embodiment shown in FIG. 3d.

Further, in the second embodiment, it is preferable from the following reason that the first layer 2 including the third layer 4 extending toward the diode side is designed to be thicker than the second layer 3 in the thyristor region 11. In the case where the first layer 2 is thicker than the second layer 3, the current amplification degree $\alpha_{12}$ of a transistor portion which consists of three layers of the second layer 3, first layer 2 and third layer 4 of the thyristor region 11 and in which $J_2$ is an emitter junction and $J_1$ is a collector junction is smaller than that $\alpha_{32}$ of a transistor portion which consists of three layers of the first layer 2, second layer 3 and fourth layer 5 of the thyristor region 11 and in which $J_3$ is an emitter junction and $J_1$ is a collector junction. The thyristor region 11 generally has a nature that it is easily triggered when an emission is initiated from the emitter junction of the transistor portion having a larger current amplification degree $\alpha_1$ rather than the emitter junction of the transistor portion having a smaller current amplification degree $\alpha$.

In order to prevent an erroneous turn-on of the thyristor region 11 by excess minority carriers stored in the diode region 12, it is thus necessary to avoid an initial emission from the emitter junction belonging to the transistor portion of a larger current amplification degree. Therefore, it is effective to extend the third layer 4, selecting the emitter junction $J_2$ belonging to the transistor portion of a smaller current amplification, rather than to extend the fourth layer 5 toward the diode region side, selecting $J_3$ as an emitter junction from which an emission is easily initiated under the influence of carriers stored in the diode region 12.

From the foregoing, it is understood that the separation region 13 formed by extending the emitter layer (third layer 4) adjacent the thick base layer (first layer 2) toward the diode region side has a more effective interference prevention function.

Figure 3C:
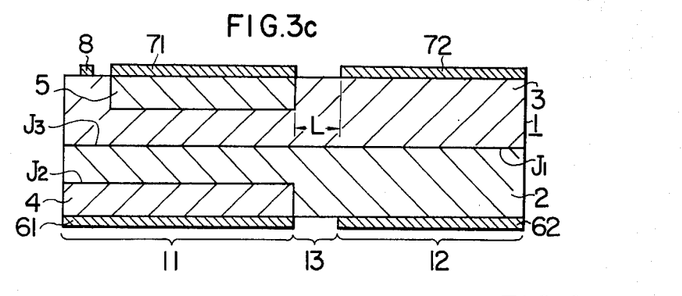

FIG. 3c shows a third embodiment of the present invention. In FIG. 3c, the ohmic contacts formed on the opposing principal surfaces of the semiconductor substrate 1 are divided into ones numbered 61, 71 in the thyristor region and ones 62, 72 in the diode region, and the distance between them is made to be at least length L which is equal to the diffusion length of stored minority carriers. By dividing the ohmic contacts in this way, a separation region 13 is formed which comprises a first layer 2 and a second layer 3 as the diode region 12, but which does not function as a diode due to the absence of ohmic contacts. A current does not flow in the separation region 13 even if the diode region 12 is forwardly biased so that no stored minority carriers are produced and the separation effect between the thyristor region and the diode region becomes greater compared with that of the separation region as shown in FIG. 1a. Thus, by forming between the thyristor region and the diode region a separation region whose width is equal to or larger than the diffusion length of carriers and in which no stored minority carriers exist, there is eliminated the disadvantage that the stored minority carriers in the diode region diffuse into the thyristor region when the load current is commutated from the diode region to the thyristor region and the thyristor region is turned on before the application of a gate signal.

As a modification of the embodiment shown in FIG. 3c the following more practical structure may be considered. That is, a high impurity concentration layer is buried in the portion of at least the high resistivity one of two layers (first layer 2 and second layer 3) exposed at one surface of the semiconductor substrate, which two layers constitute the diode region 12. The high impurity concentration layer must have the same conductivity type as the high resistivity layer. In such a structure, the function of limiting the current flow path of the diode region 12 becomes more remarkable for the same reason as described with respect to the first embodiment shown in FIG. 3a.

As a further modification the structure in which the third layer 4 extends till the interface of the diode region 12 may be considered. In this modification, too, the function of limiting the diode current flow path exists for the same reason as described with respect to the second embodiment shown in FIG. 3b. Further, in the case of this modification, since an ohmic contact may be provided to the exposed surface of the third layer 4 of the separation region 13, it is possible to provide a unitary ohmic contact of contacts 61 and 62 to one surface of the semiconductor substrate. This is due to the fact that the effect of preventing the interference between the thyristor region and the diode region exists under the same function as in the above-described second embodiment. The merit of this modification is that it is not necessary to divide one of the ohmic contacts to be adhered to the semiconductor substrate.

The diffusion length L of stored minority carriers is expressed as $$L = \sqrt{D \times \tau} \text{ (cm)}.$$

where $D$ (cm$^2$/sec) is the diffusion constant of stored minority carriers and $\tau$ (sec) is the life time of the carriers. The diffusion constant of a semiconductor element formed of a silicon substrate is 30 cm$^2$/sec for electrons and 12 cm$^2$/sec for holes and the life time of the carriers in an intermediate layer of the semiconductor element having a blocking voltage of 1000 – 2000 V is 50 – 100 $\mu$sec both for electrons and for holes, when atoms forming a recombination center are not diffused. In this case, the diffusion length is 0.4 – 0.56 mm for electrons and 0.25 – 0.35 mm for holes. Accordingly, when atoms forming a recombination center are not diffused, it is necessary for the width of the separation region to be larger than 0.56 mm, which is the larger distance for the diffusion length values or the diffusion length for electrons. This necessary value for the width of the separation region is effective in the case of a blocking voltage of 1000 – 2000 volts. If the blocking voltage becomes higher, the width of the separation region must be larger, since the life time of the carriers must be increased with the increase in the blocking voltage.

However, the separation region is designed to prevent the load current so as to suppress the stored minority carriers, so that there is a disadvantage that the effective conductive area of the separation region is small and the rated current of such a semiconductor element is somewhat smaller than that of the semiconductor substrate. However, this disadvantage can be overcome by diffusing into the separation region such atoms that act as recombination center for carriers, for example, gold, silver, indium and other heavy metal atoms. Namely, when atoms forming a recombination center such as gold atoms are diffused with a concentration of $1 \times 10^{13} - 1 \times 10^{14}$ atoms/cm$^3$, the life time of the carriers in this region is shortened to 1 $\mu$sec. The diffusion length of carriers in this region is calculated to be $\sqrt{30 \times 10^{-6}} = 0.056$ mm for electrons and $\sqrt{12 \times}$ $10^{-6} = 0.035$ mm for holes. Accordingly, when atoms forming a recombination center are to be introduced in the separation region, the width of the separation region may be larger than 0.056 mm and this value is about 1/10 of the value when no atoms for forming a recombination center are diffused.

Atoms for forming a recombination center have conventionally been diffused in a thyristor and a diode used in a high frequency circuit, and the diffusion of atoms for forming a recombination center into a separation region can be done simultaneously with the diffusion of atoms for forming a recombination center into a thyristor and diode regions when the latter diffusion process is to be done. When the diffusion is done only for the separation region, the diffusion can be performed by forming a metal film for a recombination center at the surface of the separation region and heating the film.

Figure 4:
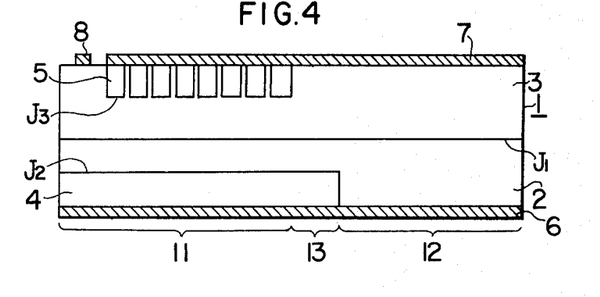
FIG. 4 is a schematic sectional diagram of a diode-integrated high speed thyristor of the present invention employing a shortened emitter structure.

In a large-sized thyristor, the emitter junction of a shorted emitter structure is generally used in order to improve the dv/dt characteristic, and the blocking voltage characteristic is a high temperature. The shorted emitter structure may be employed in the thyristor of the device of the present invention. FIG. 4 shows an improved embodiment of the present invention, employing a shorted emitter structure in the fourth layer 5. The corresponding parts are shown by the same numerals as in FIG. 3b. One difference is that the second layer 3 is exposed locally (with an approximately uniform density) in one surface of the semiconductor substrate through the fourth layer 5 buried in the second layer 3, the exposed portions of the second layer 3 being in ohmic contact with the contact 7. The advantage of such a structure will be easily understood by those skilled in the art. Though the case of employing a shorted emitter structure in the second embodiment of the present invention has be described, the shorted emitter structure may be applicable to the first or third embodiment.

In FIG. 4, though the shorted emitter structure has been used only in the fourth layer 5 adjacent to the second layer 3, the shorted emitter structure may be applicable to the third layer 4 adjacent to the first layer 2, too. In this case, the conditions are necessary that the shorted portions of the two shorted emitter structures are respectively portions through which currents of the same direction flow in an external bias state at which a forward current flows in the diode region 12 and that the impedance of the path of current flowing through the shorted portions is sufficiently larger than that of the case where a current flows in the diode region 12.

In the conventionally known reverse conducting thyristor, for example, the structure disclosed in the U.S. Pat. No. 3,437,889 in which the opposite outer layers constituting a thyristor region are formed with shorted emitter structures, the shorted portions are uniformly distributed and the diode current flow portions are diverged. If a separation region as proposed in the embodiments of FIG. 3 of the present invention is provided between the thyristor region and the diode region, the area which is occupied in the semiconductor substrate by the separation region becomes very large, making an effective use of the area of the semiconductor substrate difficult even if the width L of the separation region is made short. In a largesized diode-integrated high speed thyristor in which a large current can flow, it is preferably to make the area of the separation region as small as possible by collecting the diode current flow portions at one location and providing the separation region between those portions and the thyristor region.

Figure 5A:
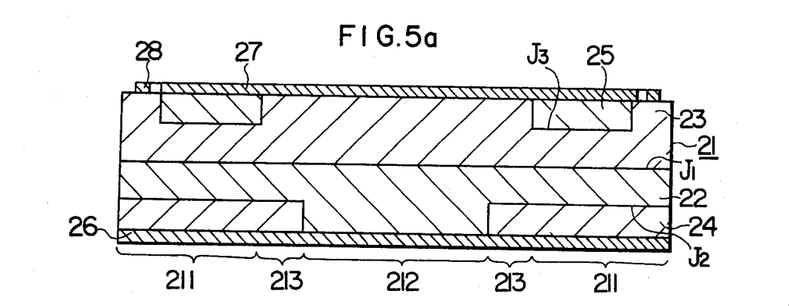
FIGS. 5a and 5b show sectional and plan views of a diode-integrated high speed thyristor of the present invention formed in a disc shape.
Figure 5B:
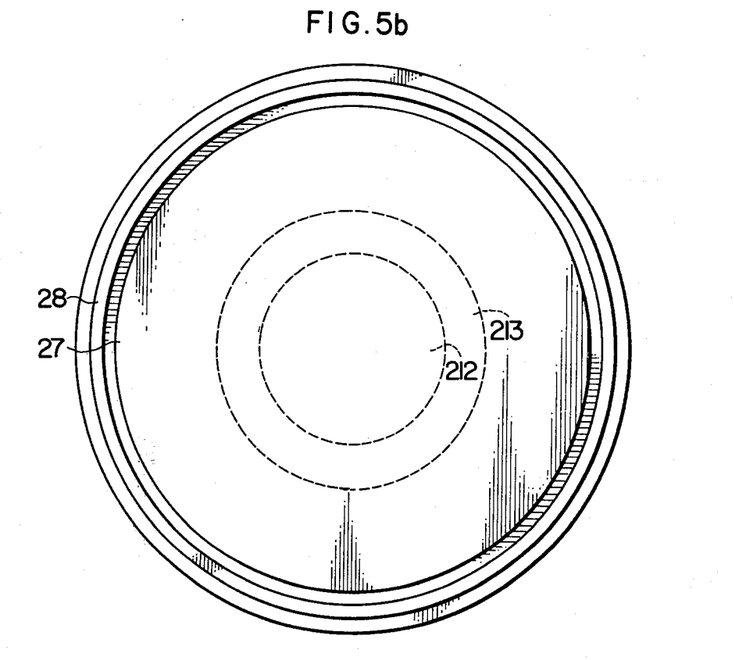

FIGS. 5a and 5b show an embodiment of a disc-shaped diode-integrated high speed thyristor of the present invention taking account into the above-described structual problem. In this figure, the structure of the separation shown in FIG. 3b is shown as an example.

The semiconductor substrate is made of a wafer cut from a silicon or germanium single crystal rod. Since the wafer is usually disc-shaped, it is preferable to make the semiconductor element disc-shaped. When the semiconductor element is to be made disc-shaped, it is preferable to form a thyristor region and a diode region concentrically and particularly to form a diode region at the center and a thyristor region around it as shown in FIGS. 5a and 5b for obtaining a semiconductor element having an excellent turn-on characteristic in the thyristor region.

In the figure, reference numeral 21 designates a silicon or germanium disc-shaped semiconductor substrate, which consists of a first layer 22 having one conductivity type and a second layer 23 having the other conductivity type which forms a central P-N junction $J_1$, a third layer 24 buried in an annular form around the periphery of the first layer 22 in such a way that its surface is exposed and a P-N junction $J_2$ is formed with the first layer 22, and a fourth layer 25 buried annularly around the periphery of the second layer 23 in a way that its surface is exposed and a P-N junction $J_3$ is formed with the second layer 23. The third layer 24 and the fourth layer 25 are provided face-to-face through the first and second layers 22 and 23, and these layers form a thyristor region 211 in the semiconductor substrate 21. The third layer 24 extends inward at least by the diffusion length L of stored minority carriers compared with the fourth layer 25 and forms a separation region 213 of width L between the thyristor region 211 and the diode region 212 which is formed at the center of the semiconductor substrate 21 and which consists of the first layer 22 and the second layer 23. Reference numerals 26 and 27 designate ohmic contacts, and numeral 28 designate an annular gate electrode formed on the surface of the second layer 23 of the thyristor region 211 in such a way as to surroundd the ohmic contact 27 at a predetermined distance.

In a semiconductor element formed in this way, the diode region 212 is formed at the center and the thyristor region 211 is provided at the periphery so that the initial conductive region of the thyristor region 211 can be made large. This advantage is more preferable when the semiconductor element is used in a high frequency circuit. Namely, the initial conductive region when the thyristor region is turned on by the gate signal is formed in a very small area near the gate electrode, and the conductive region expands in proportionality with time. Finally, the current flows through the whole thyristor region. The spreading speed of the conductive region, which depends on various factors including current density, is generally around 0.1 mm/$\mu$s. Thus, in a thyristor having a large current increase ratio di/dt at the time of turnon such as a thyristor used in a high frequency circuit, the current increase is larger than the spreading of the conductive region and an excessive current concentration may result in thermal damage to the thyristor. However, when the diode region and the thyristor region are provided at the center and at the periphery, respectively, as shown in FIGS. 5a and 5b, it is possible to lengthen the circumferential length of the fourth layer 25 acting as an emitter of a thyristor, so that the initial conductive area obtained by the annular gate electrode can be widened and the deficiency described above can be obviated. Further, when the thyristor region is provided at the periphery, the construction of the fourth layer can be made narrow and long. Thus, the conductive region spreads over the whole region of the fourth layer even when the element is used in a circuit having a short conducting time such as a high frequency circuit, and the current capacitance can be made large. The advantage of this embodiment in which th diode region is provided at the center will be explained hereunder in conjunction with concrete applications.

As mentioned early, the spreading speed of the conductive region of a thyristor is at most 0.1 mm/$\mu$s. Also, it is known that the spreading speed is slow in a thyristor doped by a life time killer such as Au. In the application field of the chopper circuit as shown in FIG. 1, since the pulse current flow period in the thyristor region is at most several tens of microseconds, the distance by which the conductive region expands during the thyristor current flow period is at most several milimeters. Therefore, it will be understood that the sufficient width of the thyristor region 211 is 5 – 6 mm in this application. When the width of the thyristor region is larger than that, a region which does not become conductive during the thyristor current flow period exists, so that the thyristor portion in the position spaced from the gate electrode by more than 5 – 6mm becomes an unnecessary area. When the gate electrode is made with a ring-shaped form positioned at the periphery of the semiconductor substrate as in the embodiment of FIGS. 5a and 5b, the thyristor region is constituted by an annular portion which is surrounded by two concentric circles, i.e. the outer circle adjacent to the gate electrode and the inner circle having a radius smaller than the outer circle by 5 – 6 mm. In the case where the semiconductor substrate is a relatively large disc of silicon having a diameter of, for example, 35 – 40 mm, room is provided in the central portion of the semiconductor substrate inward of the annular thyristor region. It is understood that the embodiment of FIGS. 5a and 5b utilizes the central portion of the semiconductor substrate as a diode region, thereby providing an ideal arrangement of a large current capacity of diode-integrated high speed thyristor.

Though an annular gate electrode is shown in the figure, the shape of the gate is not limited to an annular shape, but a known amplifier gate system may also be employed. Further, though a separation region as shown in FIG. 3b is used in the embodiment shown in FIGS. 5a and 5b, it is possible to employ the ones as shown in FIGS. 3a and 3b.

Also, in order to improve the dv/dt characteristic and the blocking voltage characteristic in a high temperature, at least one emitter junction of the thyristor region 211 may be formed with a shorted emitter structure in which the shorted portions are provided with an approximately uniform density over the entire four layer as shown in FIG. 4.

Though in the embodiment of FIGS. 5a and 5b a diode region is provided in the central portion of the semiconductor substrate, a diode-integrated high speed thyristor may be implemented in which an annular diode region and a disc-shaped thryistor region are provided respectively in the periphery portion and central portion of the substrate, a separation region being provided between the diode and thyristor regions. In this case, since the separation region of the same width is positioned more outside in comparison the embodiment FIGS. 5a and 5b, such a structure has the disadvantage that the area occupied by the separation region becomes large. However, a new effect can be obtained. That is, since each of two outer layers of the thyristor region may be shorted to the intermediate layer adjacent thereto by means of an ohmic contact, a drift current or leakage current generated at the peripheral portion of the semiconductor substrate is directly absorbed by electrodes, so that the improvement of the dv/dt characteristic and the blocking voltage characteristic in a high temperature is facilitated.

Figure 6:
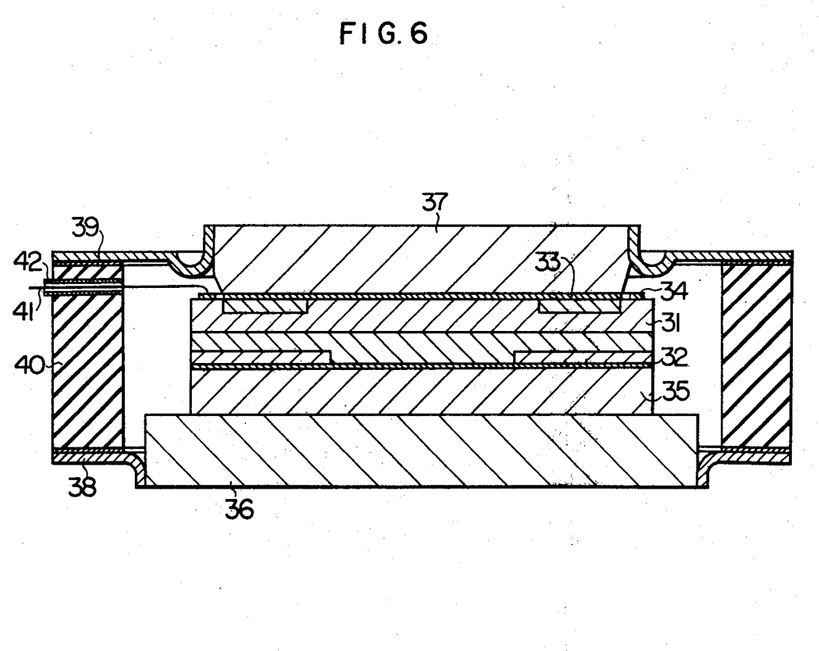
FIG. 6 is a sectional diagram showing a semi-conductor device using a diode-integrated high speed thyristor according to the present invention.

FIG. 6 shows an embodiment of the semiconductor element according to this invention, in which reference numeral 31 designates a semiconductor substrate which comprises a thyristor region, a separation region and a diode region as explained with reference to FIGS. 3a, 3b and 3c, numerals 32 and 33 designate ohmic contacts provided on the opposing principal surfaces of the semiconductor substrate 31, numeral 34 indicates an annular gate electrode, and numeral 35 indicates a support member consisting of a metal having nearly the same coefficient of thermal expansion as the semiconductor substrate 31 which is adhered to one principal surface of the semiconductor substrate 31 through the ohmic contact 32.

Reference numerals 36 and 37 designate metal blocks pressing the composition of the semiconductor substrate 31 and the support member 35, numerals 38 and 39 designate framed metal plates set to the periphery of the metal blocks 36 and 37, and numeral 40 designates an insulating cylinder set between the framed metal plates 38 and 39 and forming a case surrounding the composition of the semiconductor substrate 31 and the support member 35. Numeral 41 designates an outgoing wire for the gate electrode 34, and numeral 42 designates a pipe provided to the insulating cyclinder 40 for deriving the outgoing lead 41. The support member 35 and the metal plate block 36 are soldered, while the ohmic contact 32 and the metal block 37 are merely made into cntact and pressed from outward during usage to make good electrical and thermal contact.

As has been fully described hereinabove, a separation region is formed between a thyristor region and a diode region in the semiconductor element of this invention, so that the thyristor region is not affected by the stored minority carriers in the diode region at the time of commutation, and thus a thyristor and a diode can be formed in the same semiconductor substrate. Accordingly, the element can be made smaller than the conventional ones, in which a thyristor and a diode are formed separately, and correspondingly a chopper or inverter circuit using this element can be made small and light. Further, since it is not required in this element to connect the thyristor and the diode with an external connection lead, the inductance of the lead wire can be eliminated and the element is suitable for an inverter or chopper circuit operating with a high frequency. Further, when atoms for forming a recombination center are diffused into a separation region, the separation region becomes small and the semiconductor substrate can be more fully utilized.

We claim:

1. A diode-integrated thyristor device comprising:
   (i) a disc-shaped semiconductor body having two opposing principal surfaces and including
      a. a first inner layer of a first conductivity type having a central portion exposed to one of said two opposing principal surfaces,
      b. a second inner layer of a second conductivity type, opposite said first conductivity type, having a central portion exposed on the other of said two opposing principal surfaces and disposed in contact with said first inner layer and defining therewith a first PN junction with extends laterally throughout said body,
      c. a first ring-shaped outer layer of said second conductivity type, formed in said first inner layer and defining therewith a second PN junction which terminates at said one principal surface and adjoins said central portion of said first inner layer;
      d. a second outer layer of said first conductivity type, formed in said second inner layer and defining therewith a third PN junction, an edge portion of which terminates at said other principal surface, adjoins said central portion of said second inner layer, and is circularly shaped;
   ii. a first electrode in ohmic contact on said one principal surface with the entirety of said central portion of said first inner layer and with the surface of said first outer layer;
   iii. a second electrode in ohmic contact on said other principal surface with the entirety of said central portion of said second inner layer and with the surface of said second outer layer; and
   iv. control means, coupled to one of the first and second inner layers, for supplying a trigger signal thereto; and
   wherein
      a four layer body region is defined by those portions of each of said inner and outer layers, the projections of which onto said principal surfaces overlap one another,
      a two layer body region is defined by those portions of each of said inner layers exclusive of said outer layers, the projections of which onto said principal surfaces overlap one another,
      said four layer body region, said first and second electrodes and said control means defining a ring-shaped thyristor which conducts current through the periphery of said body in a first direction,
      said two layer body region and said first and second electrodes defining a diode rectifire which conducts current through the center of said body in a second direction, opposite said first direction, and
      a ring shaped separation body region is defined by those portions of each of said inner layers and said second outer layer, the projections of which onto said principal surfaces overlap one another and adjoin both said four layer body region and said two layer body region, the width of said ring-shaped separation body region separating said four layer body region from said two layer body region being such as to prevent load current from flowing in said ring-shaped separation body region and so that the charge concentration due to current flow in said diode rectifier does not extend into said four layer body region.

2. A diode-integrated high speed thyristor device comprising:
   i. a semiconductor body having two opposing principal surfaces and including
      a. a first inner layer of a first conductivity type having a first portion exposed to one of said two opposing principal surfaces,
      b. a second inner layer of a second conductivity type, opposite said first conductivity type, having a first portion exposed on the other of said two opposing principal surfaces and disposed in contact with said first inner layer and defining therewith a first PN junction which extends laterally throughout said body, said first inner layer being highly conductive relative to said second inner layer,
      c. a first outer layer of said second conductivity type, formed in said first inner layer and defining therewith a second PN junction which terminates at said one principal surface and ajoins said first portion of said first inner layer;
      d. a second outer layer of said first conductivity type, formed in said second inner layer and defining therewith a third PN junction, an edge portion which terminates at said other principal surface and adjoins said first portion of said second inner layer;
   ii. a first electrode in ohmic contact on said one principal surface with first portion of said first inner layer and with the surface of said first outer layer;
   iii. a second electrode in ohmic contact on said other principal surface with said first portion of said second inner layer and with the surface of said second outer layer; and
   iv. control means, coupled to one of the first and second inner layers, for supplying a trigger signal thereto; and
   wherein
      a four layer body region is defined by those portions of each of said inner and outer layers, the projections of which onto said principal surfaces overlap one another,
      a two layer body region is defined by those portions of each of said inner layer exclusive of said outer layers, the projections of which onto said principal surfaces overlap one another,
      said four layer body region, said first and second electrodes and said control means defining a thyristor which conducts current through said body in a first direction,
      said two layer body region and said first and second electrodes defining a diode rectifier which conducts current through said body in a second direction, opposite said first direction,
      a separation body region is defined by those portions of each of said inner layers and said second outer layer, the projections of which onto said principal surfaces overlap one another and adjoin both said four layer body region and said two layer body region, the width of said separation body region separating said four layer body region from said two layer body region being such as to prevent load current from flowing in said separation body region and so that the charge concentration due to current flow in said diode rectifier does not extend into said four layer body region, and said first and second electrodes are disposed in ohmic contact on said first and second principal surfaces of said body including said separation body region.

3. A diode-integrated thyristor device comprising:
i. a semiconductor body having two opposing principal surfaces and including
   a. a first inner layer of a first conductivity type having a first portion exposed to one of said two opposing principal surfaces,
   b. a second inner layer of a second conductivity type, opposite said first conductivity type, having a first portion exposed on the other of said two opposing principal surfaces and disposed in contact with said first inner layer and defining therewith a first PN junction which extends laterally throughout said body,
   c. a first outer layer of said second conductivity type, formed in said first inner layer and defining therewith a second PN junction which terminates at said one principal surface and adjoins said first portion of said first inner layer;
   d. a second outer layer of said first conductivity type, formed in said second inner layer and defining therewith a third PN junction, an edge portion of which terminates at said other principal surface and adjoins said firt portion of said second inner layer;
ii. a first electrode in ohmic contact on said one principal surfaces with said first portion of said first inner layer and with the entirety of the surface of said first outer layer;
iii. a second electrode in ohmic contact on said other principal surface with said first portion of said second inner layer and with the entirety of the surface of said second outer layer; and
iv. control means, coupled to one of the first and second inner layers, for supplying a trigger signal thereto; and
wherein
   a four layer body region is defined by those portions of each of said inner and outer layers, the projections of which onto said principal surfaces overlap one another,
   a two layer body region is defined by those portions of each of said inner layers exclusive of said outer layers, the projections of which onto said principal surfaces overlap one another,
   said four layer body region, said first and second electrodes and said control means defining a thyristor which conducts current through said body in a first direction,
   said two layer body region and said first and second electrodes defining a diode rectifier which conducts current through said body in a second direction, opposite said first direction,
   one of said first and second inner layers further includes, within said two layer body region, a surface layer having a conductivity type the same as that of said one of said first and second inner layers and a conductivity greater than that of said one of said first and second inner layers, said surface layer region being spaced apart from said four layer body region, and
   a separation body region is defined by those portions of each of said inner layers exclusive of said surface layer and exclusive of said four layer body region, the projections of which onto said principal surfaces overlap one another and adjoin both said four layer body region and said surface layer, the width of said separation body region separating said four layer body region from said two layer body region, including said surface layer, being such as to prevent load current from flowing in said separation body region and so that the charge concentration due to current flow in said diode rectifier does not extend into said four layer body region.

4. A diode-integrated high speed thyristor device according to claim 3, wherein said four layer body region, said separation region and said two layer body region are concentrically disposed in said body.

5. In a diode-integrated high speed thyristor device which comprises
   a. a semiconductor body having two opposed major surfaces and four layers of alternate conductivity type comprising
      i. a first inner layer of a first conductivity type, having a portion exposed to one of said major surfaces,
      ii. a second inner layer of second conductivity type opposite said first conductivity type, having a portion exposed to the other of said major surfaces and adjoining said first inner layer thereby forming a first P-N junction which extends laterally throughout said semiconductor body, said first inner layer being highly conductive relative to said second inner layer,
      iii. a first outer layer of said second conductivity type formed in said first inner layer, thereby forming with said first inner layer a second P-N junction the edge face of which is exposed to said one major surface adjacent said portion of said first inner layer, and
      iv. a second outer layer of said first conductivity type, formed in said second inner layer at a position opposed to said first outer layer, thereby forming with said second inner layer a third P-N junction the edge face of which is exposed to said other major surface, whereby a four-layer region is defined by said four adjacent layers and a two-layer region juxtaposed with said four-layer region is defined by said portions to said two inner layers;
   b. a first electrode in ohmic contact with the portions of said first inner and first outer layers, at said one major surface;
   c. a second electrode in ohmic contact with the portions of said second inner and second outer layers, at said other majors surface; and
   d. control means for triggering said device, in contact with the surface of one of said four layers, apart from both said first and second electrodes and said two-layer region;
   the improvement wherein said second outer layer has an extension portion extending toward said two-layer region so as to form a three-layer separation region made up of said first and second inner layers and the extending portion of said second outer layer, thereby separating said four-layer region from said two-layer region, said separation region having such a large distance that a load current is prevented substantially from flowing in said separation region and the charge concentration due to current flow in said two-layer region does not substantially extend into said four-layer region, and wherein said four-layer region and said first and second electrodes and said control means define a thyristor which conducts current in a first direction, and said two-layer region and first and second elect rodes define a diode rectifier which conducts current in a second direction opposite said first direction and said separation region does not conduct current in said first and second directions and provides isolation between said thyristor and said diode rectifier.

6. A diode-integrated high speed thyristor device according to claim 5, wherein said four-layer region, said separation region and said two-layer region are concentrically disposed in said body.

7. A diode-integrated high speed thyristor device according to claim 5, wherein atoms for forming recombination centers are diffused at least into said separation region.

8. A diode-integrated high speed thyristor device according to claim 5, wherein that portion of said second inner layer which is disposed within said two-layer region has a surface layer of said second conductivity type, exposed to said other major surface, and having a higher conductivity relative to said second inner layer.

* * * * *